United States Patent
Hashimoto

(10) Patent No.: US 6,756,774 B2
(45) Date of Patent: Jun. 29, 2004

(54) CONSTANT VOLTAGE SOURCE, A CONSTANT VOLTAGE SOURCE CIRCUIT BOARD AND A METHOD FOR APPLYING A CONSTANT VOLTAGE

(75) Inventor: Yoshihiro Hashimoto, Tokyo (JP)

(73) Assignee: Advantest Corporation (JP)

( * ) Notice: Subject to any disclaimer, the term of this patent is extended or adjusted under 35 U.S.C. 154(b) by 220 days.

(21) Appl. No.: 09/936,739

(22) PCT Filed: Jan. 12, 2001

(86) PCT No.: PCT/JP01/00110
§ 371 (c)(1),
(2), (4) Date: Jan. 2, 2002

(87) PCT Pub. No.: WO01/52012
PCT Pub. Date: Jul. 15, 2001

(65) Prior Publication Data
US 2002/0135340 A1 Sep. 26, 2002

(30) Foreign Application Priority Data
Jan. 12, 2000 (JP) ........................................ 2000-003970

(51) Int. Cl.[7] ................................................ G05F 1/40
(52) U.S. Cl. ........................ 323/280; 323/232; 323/352
(58) Field of Search ................................ 323/232, 233, 323/247, 274, 275, 280, 281, 293, 352, 370, 312, 276

(56) References Cited

U.S. PATENT DOCUMENTS 5,559,423 A  * 9/1996  Harman ........................ 323/277
6,147,549 A    11/2000  Ohno ............................ 327/541

FOREIGN PATENT DOCUMENTS

| JP | 6-80345    | 11/1994 |           |
|----|------------|---------|-----------|
| JP | 9-55637    | 2/1997  |           |
| JP | 10-327036  | 12/1998 |           |
| JP | 11-24766   | 1/1999  |           |
| JP | 11-153641  | 6/1999  |           |
| KR | 1999-007415| 1/1999  | H03H/7/24 |

OTHER PUBLICATIONS

Office Action dated Apr. 16, 2002 cited in corresponding Japanese Patent Application 2000–003970; 3 pages.
Korean Office Action dated Aug. 25, 2003 (2 pgs.).
English Translation of Korean Application No. 6–80345 (5 pgs.).

* cited by examiner

*Primary Examiner*—Jessica Han
(74) *Attorney, Agent, or Firm*—Osha Novak & May L.L.P.

(57) ABSTRACT

A constant voltage source includes a constant voltage supplying circuit including an operational amplifier for supplying an output voltage to a load and a feedback circuit for feeding back the output voltage to the operational amplifier; a first inductance unit disposed between the constant voltage supplying circuit and the load; and a first bypass capacitor of which one terminal is coupled between the first inductance unit and the load and the other terminal is coupled to a constant voltage unit. The constant voltage source further includes a compensation circuit including a second resistor, a second inductance unit and a second bypass capacitor, one end of each of the second resistor, the second inductance unit and the second bypass capacitor being coupled to each other, wherein the other end of the second resistor is coupled to an end of the first inductance unit near the constant voltage supplying circuit, the other end of the second inductance unit is coupled to a load side end of the first inductance unit and the other end of the second bypass capacitor is coupled to the constant voltage unit.

35 Claims, 16 Drawing Sheets

FREQUENCY CHARACTERISTIC OF
OPERATIONAL AMPLIFIER

FREQUENCY CHARACTERISTIC OF
CR CIRCUIT

500

CONSTANT VOLTAGE SOURCE, A CONSTANT VOLTAGE SOURCE CIRCUIT BOARD AND A METHOD FOR APPLYING A CONSTANT VOLTAGE

This is application is a 371 of PCT/JP01/00110 filed on Jan. 12, 2001, further of a Japanese patent application, 2000-3970 filed on Jan. 12, 2000, the contents of which are incorporated herein by reference.

BACKGROUND OF THE INVENTION

1. Field of the Invention

The present invention relates to a constant voltage source, a constant voltage source circuit board and a method for supplying a constant voltage. The present invention also relates to a Japanese Patent Application No. 2000-3970 filed at Jan. 12, 2000, which is incorporated herein by reference.

2. Description of the Related Art

There is a conventional method for testing a semiconductor integrated circuit device using a semiconductor testing apparatus, where a constant voltage is supplied to the semiconductor integrated circuit device and a constant-current is measured. The semiconductor testing apparatus includes a constant voltage source for applying a constant voltage to a load. However, when the load enters into an operating state from a stand-by state, a current flows out of the constant voltage source and the voltage in the constant voltage source near the semiconductor device drops.

In general, a conventional constant voltage source has an operational amplifier and a feedback circuit The feedback circuit provides output voltage feedback to the operational amplifier, so that voltage variation is suppressed. However, as the operating speed of the semiconductor integrated circuit increases, testing on a high frequency range is required. Therefore, the output voltage feedback by the feedback circuit cannot follow the voltage variation.

Another conventional constant voltage source includes a bypass capacitor near the load in order to suppress voltage drop in the constant voltage source near the load. Since the bypass capacitor is located near the load, it is possible to correct the output voltage quicker than the feedback circuit. Therefore, it is possible to perform testing on a high frequency range, which is required as the operating speed of the semiconductor integrated circuit increases.

However, since the bypass capacitor is located near the load, the area of the bypass capacitor should be small. Therefore, it is impossible to make the capacitance of the bypass capacitor be enough to fully correct the output voltage variations. Further, in general, the bypass capacitor is coupled to the load in parallel. Therefore, a resistor and the constant voltage source in the constant voltage source form a CR circuit. The frequency characteristics of the CR circuit and the operational amplifier make the operation of the constant voltage source on a high frequency range unstable. If the capacitance of the bypass capacitor is increased, the operation of the constant voltage source becomes unstable even on a low frequency range.

Recently, operating speed of the semiconductor device has become increasingly faster. Therefore, it is required that the semiconductor testing apparatus perform a stable operation on a high frequency range by considering line resistances etc. as the operating speed increases. Further, it is also desirable to increase operating speed of the testing apparatus in order to increase throughput.

Therefore, it is required that the constant voltage source supply a predetermined level of output voltage to the load independently of the variation of currents supplied to the load.

Further, it is also required that the constant voltage source fully correct the output voltage supplied to the load before output voltage feedback of the feedback circuit follows the output voltage variation if the output voltage variation is dependent on the variation of currents flowing to the load.

Further, it is also required that the constant voltage source supply stable output voltage to the load during the operation on a high frequency range as the operating speed of a semiconductor integrated circuit device increases.

Further, it is also required that the semiconductor testing apparatus perform a stable testing on a high frequency range by considering line resistances etc. as the operating speed of a semiconductor integrated circuit device increases, and that the operating speed of the testing apparatus be increased in order to increase throughput.

Therefore, it is the object of the present invention to provide a constant voltage source, a constant voltage source circuit board and a method for supplying a constant voltage, which can meet the above and other requirements. The above object of the present invention can be achieved by combinations of features of independent claims. Dependent claims provide other preferred features of the present invention.

Therefore, it is an object of the present invention to provide a constant voltage Source, a constant voltage source circuit board and a method for applying a constant voltage which is capable of overcoming the above drawbacks accompanying the conventional art. The above and other objects can be achieved by combinations described in the independent claims. The dependent claims define further advantageous and exemplary combinations of the present invention.

SUMMARY OF THE INVENTION

According to the first aspect of the present invention, a constant voltage source circuit comprising: a constant voltage supplying circuit comprising an operational amplifier for supplying an output voltage to a load and a feedback circuit for feeding back the output voltage to the operational amplifier; a first inductance unit disposed between the constant voltage supplying circuit and the load; and a first bypass capacitor of which one terminal is coupled between the first inductance unit and the load and the other terminal is coupled to a constant voltage unit.

Inductance between the first bypass capacitor and the load of the constant voltage source circuit may be smaller than inductance between the constant voltage supplying circuit and the load.

The constant voltage source circuit may further comprise a first resistor coupled to the first inductance unit in parallel.

The constant voltage source circuit may further comprise a compensation circuit comprising a second resistor, a second inductance unit and a second bypass capacitor, one end of each of the second resistor, the second inductance unit and the second bypass capacitor being coupled to each other, wherein the other end of the second resistor is coupled to an end of the first inductance unit near the constant voltage supplying circuit, the other end of the second inductance unit is coupled to a load side end of the first inductance unit and the other end of the second bypass capacitor is coupled to the constant voltage unit.

Inductance between the second bypass capacitor and the load of the constant voltage source circuit maybe larger than inductance between the first bypass capacitor and the load.

Capacitance of the second bypass capacitor of the constant voltage source circuit may be larger than capacitance of the first bypass capacitor.

Inductance of the second inductance unit of the constant voltage source circuit maybe smaller than inductance of the first inductance unit.

At least one of inductances between respective the first and second bypass capacitors and the load of the constant voltage source circuit maybe inductance of respective wiring lines between the first and second bypass capacitors and the load.

At least one of the first and second inductance units of the constant voltage source circuit may be a wiring line.

Inductances between respective the first and second bypass capacitors and the load of the constant voltage source circuit may be inductances of wiring lines between the first or second bypass capacitors and the load, and the first and second inductance units may be wiring lines.

The constant voltage source circuit may further comprise: a first compensation circuit comprising a second resistor, a second inductance unit and a second bypass capacitor, one end of each of the second resistor, the second inductance unit and the second bypass capacitor being coupled to each other, wherein the other end of the second resistor is coupled to an end of the first inductance unit near the constant voltage supplying circuit, the other end of the second inductance unit is coupled to a load side end of the first inductance unit and the other end of the second bypass capacitor is coupled to the constant voltage unit; and a second compensation circuit comprising a third resistor, a third inductance unit and a third bypass capacitor, one end of each of the third resistor, the third inductance unit and the third bypass capacitor being coupled to each other, wherein the other end of the third resistor is coupled to an end of the first inductance unit near the constant voltage supplying circuit, the other end of the third inductance unit is coupled to a load side end of the first inductance unit and the other end of the third bypass capacitor is coupled to the constant voltage unit.

Inductance between the second bypass capacitor and the load of the constant voltage source circuit may be larger than inductance between the first bypass capacitor and the load, and inductance between the third bypass capacitor and the load may be larger than inductance between the second bypass capacitor and the load.

Capacitance of the second capacitor of the constant voltage source circuit maybe larger than capacitance of the first capacitor, and capacitance of the third capacitor may be larger than capacitance of the second capacitor.

Inductances of the second and third inductance units of the constant voltage source circuit may be smaller than inductance of the first inductance unit, and inductance of the third inductance unit may be larger than inductance of the second inductance unit.

Resistance of the third resistor of the constant voltage source circuit maybe larger than resistance of the second resistor.

At least one of inductances between respective the first, second and third bypass capacitors and the load of the constant voltage source circuit may be inductance of respective wiring lines between the first, second and third bypass capacitors and the load.

At least one of the first, second and third inductance units of the constant voltage source circuit may be a wiring line.

Inductances between respective the first, second and third bypass capacitors and the load of the constant voltage source circuit may be inductances of respective wiring lines between the first, second and third bypass capacitors and the load, and the first, second and third inductance units may be wiring lines.

According to the second aspect of the present invention, a constant voltage source circuit board comprises: a constant voltage supplying circuit comprising an operational amplifier for supplying an output voltage to a load and a feedback circuit for feeding back the output voltage to the operational amplifier; a first inductance unit disposed between the constant voltage supplying circuit and the load; and a first bypass capacitor of which one terminal is coupled between the first inductance unit and the load and the other terminal is coupled to a constant voltage unit, wherein the first bypass capacitor is disposed near the load.

The first inductance unit of constant voltage source circuit board may be a wiring line.

The constant voltage source circuit board may further comprise: a first compensation circuit comprising a second resistor, a second inductance unit and a second bypass capacitor, one end of each of the second resistor, the second inductance unit and the second bypass capacitor being coupled to each other, wherein the other end of the second resistor is coupled to an end of the first inductance unit near the constant voltage supplying circuit, the other end of the second inductance unit is coupled to a load side end of the first inductance unit and the other end of the second bypass capacitor is coupled to the constant voltage unit; and the second bypass capacitor is disposed at a place farther than a place where the first bypass capacitor is disposed from the load.

At least one of inductances between respective the first and second bypass capacitors and the load may be inductance of respective wiring lines between the first and second bypass capacitors and the load.

At least one of the first and second inductance units may be a wiring line.

Inductances between respective the first and second bypass capacitors and the load maybe respectively inductances of wiring lines between the first and second bypass capacitors and the load, and the first and second inductance units may be wiring lines.

Capacitance of the second capacitor may be larger than capacitance of the first capacitor.

Inductance of the second inductance unit may be smaller than inductance of the first inductance unit.

The constant voltage source circuit board may further comprise: a second compensation circuit comprising a third resistor, a third inductance unit and a third bypass capacitor, one end of each of the third resistor, the third inductance unit and the third bypass capacitor being coupled to each other, wherein the other end of the third resistor is coupled to an end of the first inductance unit near the constant voltage supplying circuit, the other end of the third inductance unit is coupled to a load side end of the first inductance unit and the other end of the third bypass capacitor is coupled to the constant voltage unit, and the third bypass capacitor is disposed at a place farther than a place where the second bypass capacitor is disposed from the load.

At least one of inductances between respective the first, second and third bypass capacitors and the load may be inductance of respective wiring lines between the first, second and third bypass capacitors and the load.

At least one of the first, second and third inductance units may be a wiring line.

Inductance between respective the first, second or third bypass capacitors and the load may be inductance of respective wiring lines between the first, second or third bypass capacitors and the load, and the first, second or third inductance units may be wiring lines, respectively.

Capacitance of the second capacitor may be larger than capacitance of the first capacitor, and capacitance of the third capacitor may be larger than capacitance of the second capacitor.

Inductance of the third inductance unit may be larger than inductance of the second inductance unit and smaller than inductance of the first inductance unit.

At least one of the first, second and third bypass capacitors may be disposed around the load.

At least a portion of the wiring line may be disposed around the load.

At least a portion of at least one of wiring lines between respective the first, second and third bypass capacitors and the load may be piled over other wiring line.

One wiring line of constant voltage source circuit board may be insulated from the other wiring line.

At least a portion of at least one of wiring lines between respective the first, second and third bypass capacitors and the load may be formed to pile up over at least one of the first, second and third bypass capacitors.

One wiring line of constant voltage source circuit board may be coupled to an electrode of the at least one of the first, second and third bypass capacitors.

At least a portion of at least one of wiring lines between respective of the first, second and third bypass capacitors and the load may be formed to pile up over the load.

According to the third aspect of the present invention, a method for supplying a predetermined voltage to a load comprising steps of: generating a voltage by using a constant voltage supplying circuit comprising an operational amplifier for generating the voltage supplied to the load and a feedback circuit for feeding back the output voltage from the operational amplifier to the operational amplifier; supplying the voltage to the load through a first inductance unit disposed between the constant voltage supplying circuit and the load; supplying a current to the load by using a first bypass capacitor of which one terminal is coupled between the first inductance unit and the load and the other terminal is coupled to a constant voltage unit; and charging the first bypass capacitor through the first inductance unit.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
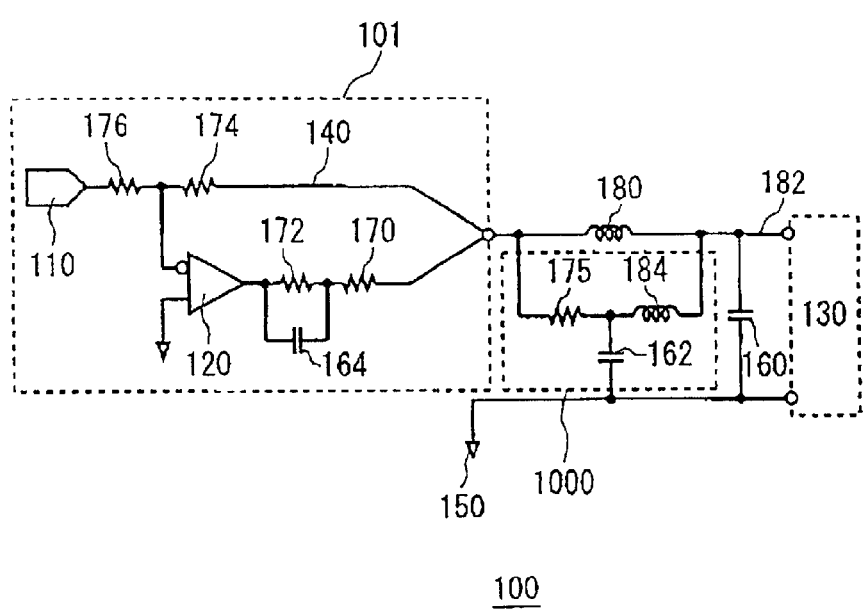
FIG. 1 shows a constant voltage source of the first embodiment according to the present invention

FIG. 1 shows a constant voltage source 100 of the first embodiment according to the present invention. Power source 110 supplies an output voltage to a load 130 through an operational amplifier 120. A feedback circuit 140 feeds the output voltage back to the operational amplifier 120. Therefore, the operational amplifier 120 has a function of regulating the output voltage when the output voltage fluctuates. The output voltage may temporarily have a variation in voltage level, but returns to a predetermined level by the operational amplifier 120 through the feedback circuit 140. Resistors 174 and 176 determine a transfer function and a feedback ratio. A current measuring resistor 172 is used for measuring value of a current flowing to the load 130 from the constant voltage source 100. A bypass capacitor 160 is preferably disposed in the constant voltage source 100 near the load 130. Therefore, if the current supplied to the load 130 varies, the current is immediately compensated to suppress output voltage drop. In order to suppress oscillation of the output voltage due to a CR circuit of the current measuring resistor 172 and the bypass capacitor 160, a phase correcting capacitor 164 is coupled to the current measuring resistor 172 in parallel. A line resistor 170 is a wiring resistor to the load 130 from the constant voltage source 100. An inductance unit 180 is disposed between the constant voltage source 100 to the load 130. A line inductance is preferably used as the inductance unit 180 without using a separate inductor. A constant voltage unit 150 is preferably coupled to a ground. However, the constant voltage unit 150 is not necessarily coupled to the ground, but may be coupled to a predetermined reference voltage. The feedback circuit 140 may further include a voltage follower using an operational amplifier.

The constant voltage source 100 further includes a compensation circuit 1000. The compensation circuit 1000 includes a resistor 175, an inductance unit 184 and a bypass capacitor 162. One end of each of the resistor 175, the inductance unit 184 and the bypass capacitor 162 is coupled to one another. The other end of the resistor 175 is coupled to an end of an inductance unit 180 near the constant voltage supplying circuit. The other end of the inductance unit 184 is coupled to a load side end of the inductance unit 180. The other end of the bypass capacitor is coupled to the constant voltage unit 150. The function of the compensation circuit 1000 is described later.

Structure and function of the constant voltage source 100 of the present embodiment is described in detail.

The load 130 is, for example, a semiconductor integrated circuit. The current supplied to the load 130 from the constant voltage source 100 varies according to the operation of the load 130. If the variation of the current supplied to the load 130 is large, the output voltage of the constant voltage source varies. For example, if the semiconductor integrated circuit enters into an operating state from a stand-by state, the larger the current flows into the semiconductor integrated circuit, the larger the output voltage drop. Recently, the degree of integration of semiconductor integrated circuit has increased. Therefore, when the semiconductor integrated circuit is in operation, the semiconductor integrated circuit sometimes requires a large supply current. The difference in supply currents when the semiconductor integrated circuit is in stand-by state from when it is in operation state is great. As a result, the output voltage drop also becomes great.

Further, in case the supply current to the load 130 is large when it is in operation, the output voltage must be decreased in order to decrease power consumption. In this case, the output voltage drop against the output the voltage becomes very remarkable. As a result, for example, as the degree of integration of the semiconductor integrated circuit is increased, the effect of the output voltage drop supplied to the semiconductor integrated circuit is significantly increased.

Furthermore, the operation speed of the semiconductor integrated circuit has recently increased. The operating frequency, or the periodic change of operating state of the load 130 to an operating state from a stand-by state, has increased. Therefore, in some cases, the time consumed for the feedback circuit 140 and the operational amplifier to return the fluctuated output voltage to a predetermined voltage level cannot follow the operating frequency. As a result, it is impossible to supply a predetermined output voltage to the load 130, and this becomes a cause of measuring errors or malfunction.

In order to comply with the semiconductor integrated circuits of fast operating speed, the bypass capacitor 160 is disposed near the load 130. Since the bypass capacitor 160 is disposed near the load 130, it is possible to immediately respond to a change of the output voltage and supply a current. This relieves a quick change of the output voltage to some degree.

However, since the bypass capacitor 160 is disposed near the load 130, it is impossible to use one that is physically large. In other words, the bypass capacitor 160 cannot have a large capacitance. Therefore, it is difficult to supply enough current to the load in response to a large change in the current.

Figure 2:
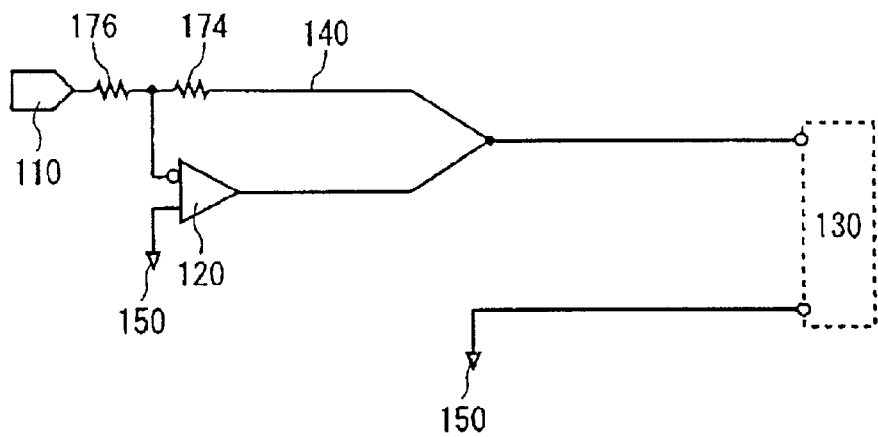
FIG. 2 shows a constant voltage source for supplying a constant voltage to a load through an operational amplifier from a voltage source.

FIG. 2 shows the constant voltage source 100 of FIG. 1 from which the compensation circuit 1000, the inductance unit 180, the bypass capacitor 160, the current measuring resistor 172 and the phase correcting capacitor 164 are removed. In other words, FIG. 2 shows a constant voltage source for supplying a constant voltage to the load 130 through the operational amplifier 120 from the power source 110 (but, if the inductance unit 180 is a line inductance, the inductance unit 180 is included in practice). The output voltage is feedback to an inversing input terminal of the operational amplifier 120 through the feedback circuit 140. Therefore, the circuit shown in FIG. 2 is a negative-feedback circuit.

Figure 3:
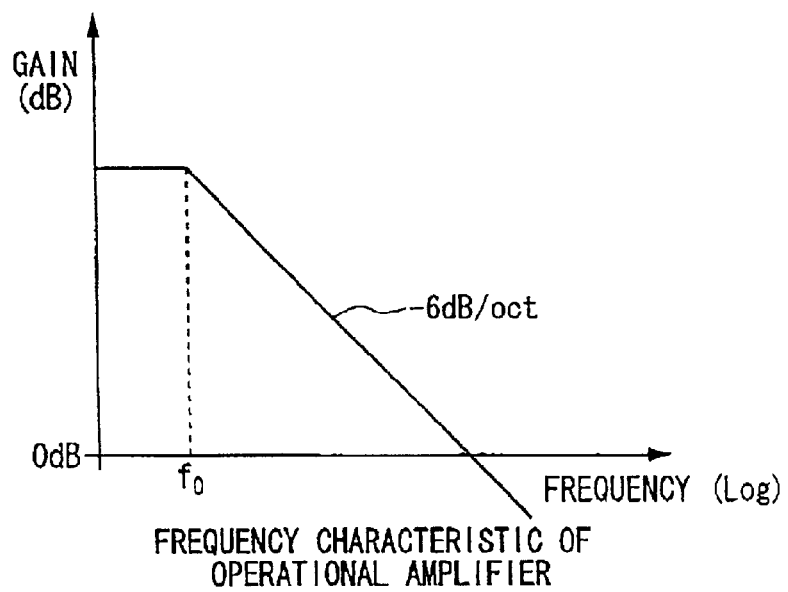
FIG. 3 shows a schematic diagram of frequency characteristic of an operational amplifier.

FIG. 3 shows a schematic diagram of frequency characteristic of an operational amplifier. Generally the inside of the operational amplifier includes resistance and capacitance The resistance and capacitance of the operational amplifier constructs a low pass filter. Further, since the operational amplifier generally has stability when used as a negative feedback circuit, it has a near first order lagging characteristic. Therefore, as shown in FIG. 3, since the frequency characteristic of the operational amplifier has an attenuation of gain in a high frequency range, it has a near first order lagging characteristic when the frequency is higher than f0. The gain attenuation has an inclination of −6 dB/oct in the sufficiently high frequency range.

Figure 4:
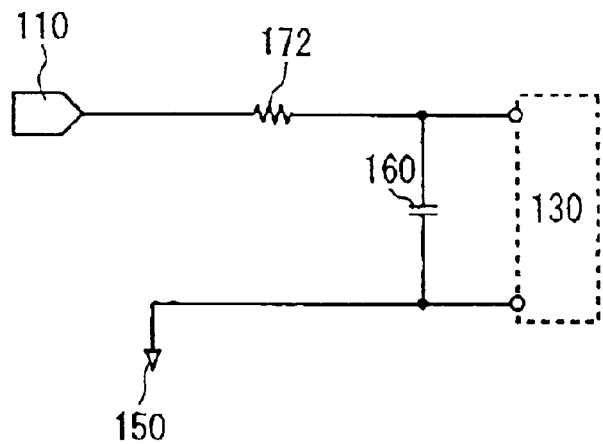
FIG. 4 shows a CR circuit having a current measuring resistor and a bypass capacitor.

FIG. 4 shows a CR circuit having the current measuring resistor 172 and the bypass capacitor 160. The constant voltage source 100 includes the current measuring resistor 172 for measuring output current. Therefore, the current measuring resistor 172 and the bypass capacitor 160 compose a series CR circuit.

Figure 5:
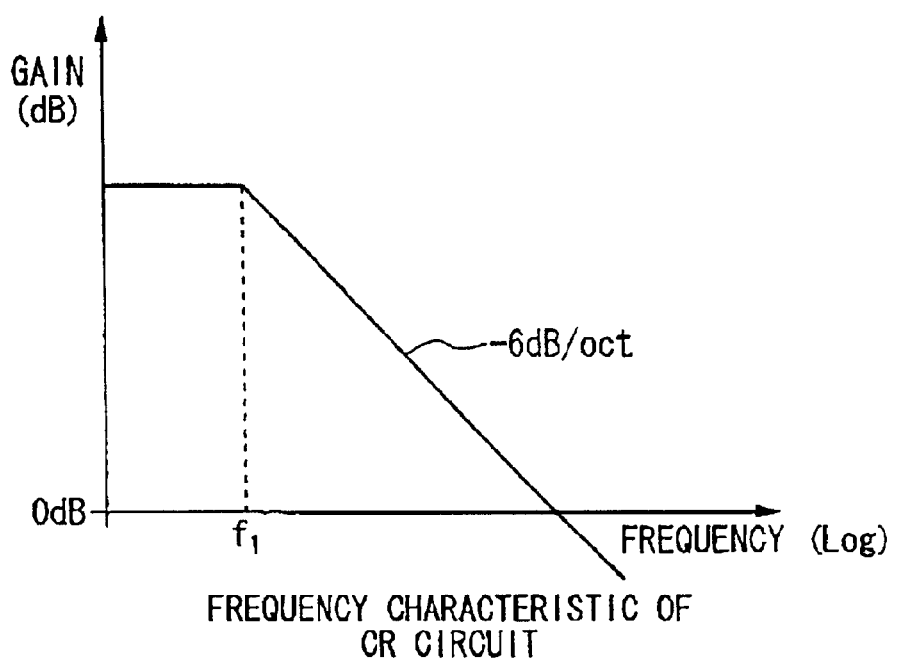
FIG. 5 shows a schematic diagram of frequency characteristic of the CR circuit shown in FIG. 4.

FIG. 5 shows a schematic diagram of frequency characteristic of the CR circuit shown in FIG. 4. As shown in FIG. 4, the load 130 is coupled to the bypass capacitor 160 in parallel. Therefore, as shown in FIG. 5, the frequency characteristic of the CR circuit composed of the current measuring resistor 172 and the bypass capacitor 160 has a first order lagging characteristic in a range where the frequency is higher than f1. The gain attenuation has an inclination of −6 dB/oct in the sufficiently high frequency range.

Figure 6:
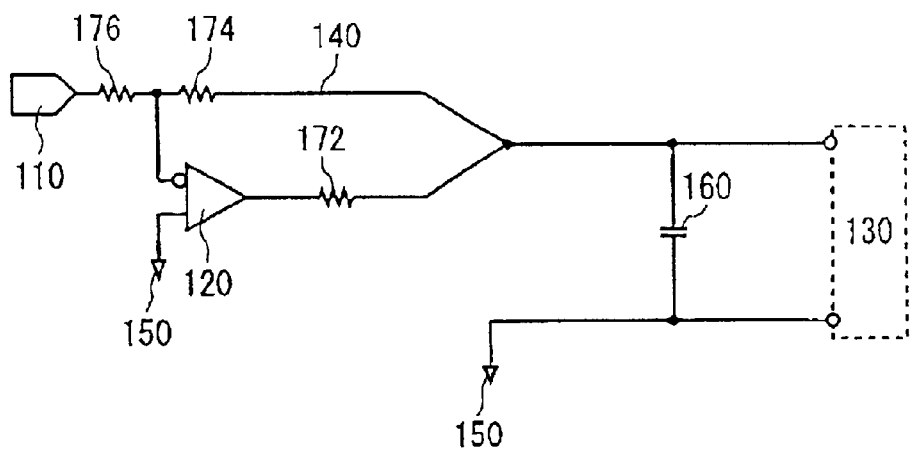
FIG. 6 shows a constant voltage source having a CR circuit composed of a current measuring resistor and a bypass capacitor for supplying a constant voltage to the load 130 through the operational amplifier.

FIG. 6 shows a constant voltage source having the CR circuit composed of the current measuring resistor 172 and the bypass capacitor 160 for supplying a constant voltage to the load 130 through the operational amplifier 120. In other words, FIG. 6 shows a constant voltage source including circuits shown in FIGS. 2 and 4.

Figure 7:
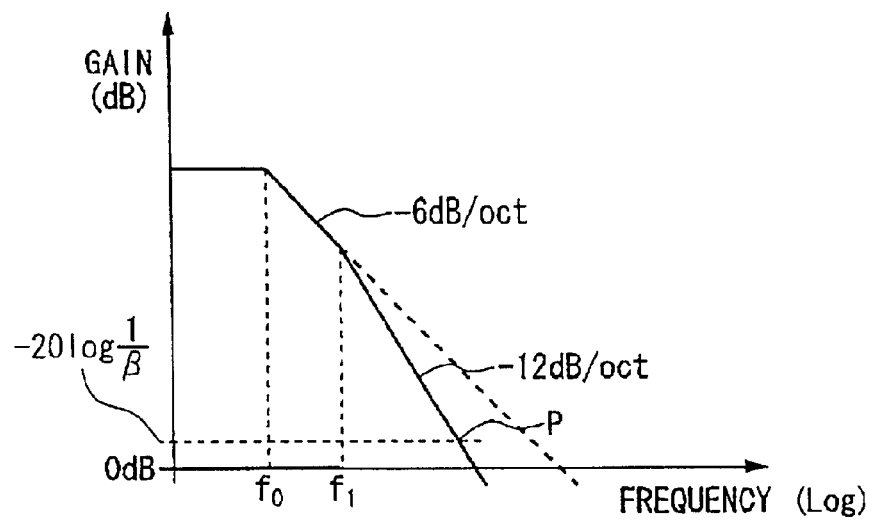
FIG. 7 shows a schematic diagram of frequency characteristic of the constant voltage source shown in FIG. 6.

FIG. 7 shows a schematic diagram of frequency characteristic of the constant voltage source shown in FIG. 6. Since the constant voltage source shown in FIG. 6 includes circuits shown in FIGS. 2 and 4., the frequency characteristic of the constant voltage source shown in FIG. 6 includes the frequency characteristics shown in FIGS. 3 and 5. Here, it is assumed that the frequency f1 is higher than the frequency f0. First, as the operating frequency of the load 130 is increased, the frequency characteristic follows that of the operational amplifier 120 and the gain is attenuated at the inclination of −6 dB/oct when the frequency is the frequency f0. Next, when the frequency is higher than the frequency f1, since the frequency characteristic has a near second order lagging characteristic following that of the CR circuit having the current measuring resistor 172 and the bypass capacitor 160, and the gain attenuation has an inclination of −12 dB/oct.

In general, in case of the first order lagging characteristic, in other words in case the inclination of the frequency characteristic is −6 dB/oct, phase lagging of an output signal is less than 90 degrees to that of an input signal. Therefore, the phase difference between the input and output signals is less than 90 degrees. As a result, the phase difference between the input voltage from the power source 110 and the output voltage feedback from the feedback circuit 140 is less than 90 degrees under the effect of the frequency characteristic of the operational amplifier 120 alone.

On the other hand, in case of the second order lagging characteristic, in other words in case the inclination of the frequency characteristic is −12 dB/oct, the phase lagging of an output signal is less than 180 degrees to that of an input signal. Therefore, the phase difference between the input and output signals is less than 180 degrees. As a result, the phase difference between the input voltage from the power source 110 and the output voltage feedback from the feedback circuit 140 is less than 180 degrees because the frequency characteristic of the operational amplifier 120 is superposed by that of the CR circuit of the current measuring resistor 172 and the bypass capacitor 160.

Here, the feedback circuit 140 is a negative feedback circuit for feeding back the output terminal into a reversing input terminal Therefore, in case the difference in phases of the input voltage from the voltage source 110 and the output voltage feedback by the feedback circuit 140 is less than 90 degrees, the output voltage feedback by the feedback circuit 140 only has a lagging response time difference in regard to the input voltage from the voltage source 110. In other words, the output voltage feedback from the feedback circuit 140 has a function of decreasing the amplitude of the input voltage. As a result, the operational amplifier 120 and the feedback circuit 140 limits the output voltage stably at a predetermined level against the variation of the output voltage. On the other hand, in case the difference in phases of the input voltage from the voltage source 110 and the output voltage feedback by the feedback circuit 140 is larger than 90 degrees, the output voltage feedback by the feedback circuit 140 only has a leading response time difference in regard to the input voltage from the voltage source 110. In other words, the output voltage feedback from the feedback circuit 140 has a function of increasing the amplitude of the input voltage. As a result, the operational amplifier 120 and the feedback circuit 140 cannot limit the output voltage at a predetermined level against the variation of the output voltage, so that it is unstable.

In general, stability of a circuit is determined by an inclination of a frequency characteristic curve of the circuit when the gain is 0 dB. In other words, in case the phase difference of the input and output signals is less than 90 degrees when the amplitudes of the input and output signals are equal, the function of the output signal is to decrease the amplitude of the input signal. Therefore, the circuit is stable. On the other hand, in case the phase difference of the input and output signals is larger than 90 degrees when the amplitudes of the input and output signals are equal, the function of the output signal is to increase the amplitude of the input signal. Therefore, the circuit is unstable.

However, the constant voltage source shown in FIG. 6 includes the resistor 174 of resistance R174 and the resistor 176 of resistance R176. Therefore, the stability of the constant voltage source is determined by an inclination of the frequency characteristic curve when the gain is −20 log(1/β) dB, where β is a feedback ratio and calculated by β=R176/(R174+R176). In other words, the stability of the constant voltage source is determined by an inclination of the frequency characteristic curve at the point P shown in FIG. 7. Therefore, if an inclination of the frequency characteristic curve at the point P is −6 dB/oct, the phase difference of the input and output signals is less than 90 degrees and the circuit is stable. On the other hand, if an inclination of the frequency characteristic curve at the point P is −12 dB/oct, the phase difference of the input and output signals is larger than 90 degrees and the circuit is unstable.

Figure 8:
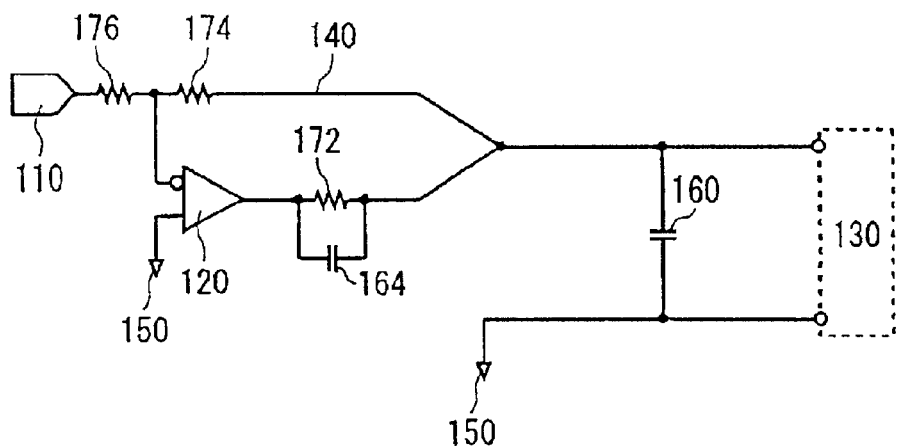
FIG. 8 shows a constant voltage source having a phase correcting capacitor added to the constant voltage source shown in FIG. 6.

FIG. 8 shows a constant voltage source having the phase correcting capacitor 164 added to the constant voltage source shown in FIG. 6. The phase correcting capacitor 164 is coupled to the current measuring resistor 172 in parallel. Therefore, the phase correcting capacitor 164 can remove the influence of the current measuring resistor 172 in a high frequency range. As a result, the phase correcting capacitor 164 can remove the influence of the CR circuit of the current measuring resistor 172 and the bypass capacitor 160. Capacitance of the phase correcting capacitor 164 can be smaller than that of the bypass capacitor 160.

Figure 9:
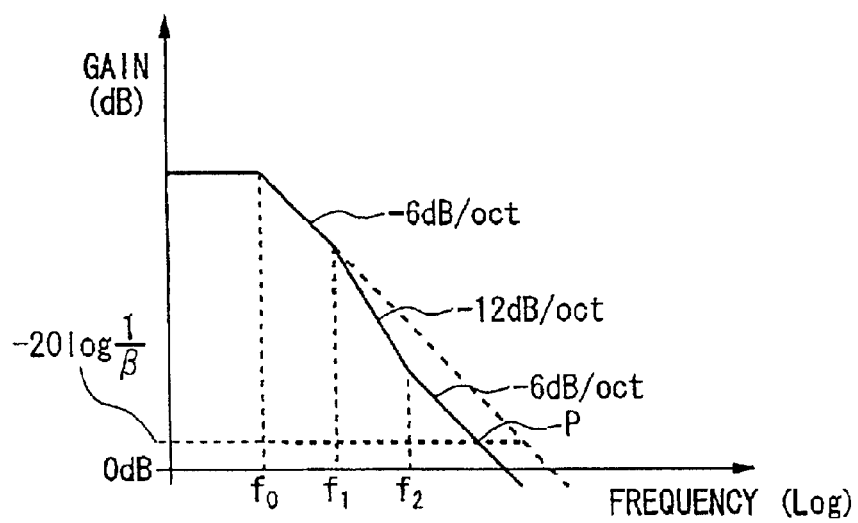
FIG. 9 shows a schematic diagram of frequency characteristic of the constant voltage source shown in FIG. 8.

FIG. 9 shows a schematic diagram of frequency characteristic of the constant voltage source shown in FIG. 8. Capacitance of the phase correcting capacitor 164 is smaller than that of the bypass capacitor 160. Therefore, the effect of the phase correcting capacitor 164 appears at frequency f2, which is higher than the frequency f1. In other words, as described before with reference to FIG. 7, in a frequency range higher than the frequency f1, the inclination of the frequency characteristic is −12 dB/oct. However, by including the phase correcting capacitor 164, the inclination of the frequency characteristic is −6 dB/oct in a frequency range higher than the frequency f2. As a result, since the inclination of the frequency characteristic is −6 dB/oct at the point P, the constant voltage source shown in FIG. 8 is stable.

Figure 10:
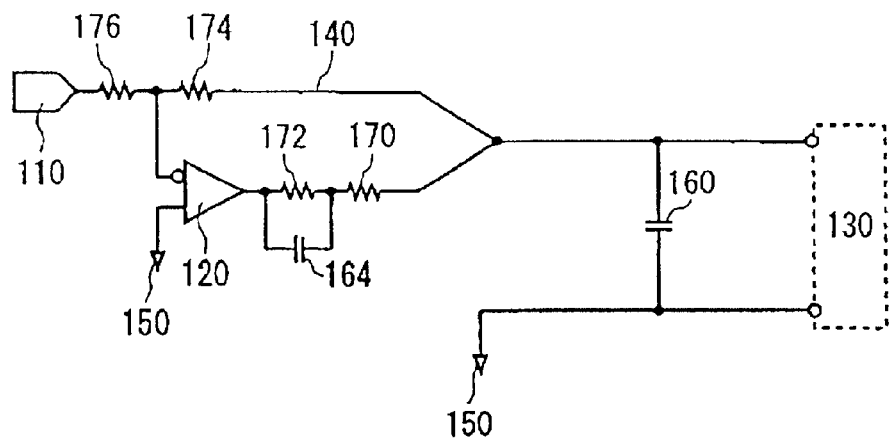
FIG. 10 shows a circuit diagram similar to the constant voltage source shown in FIG. 8.

FIG. 10 shows a constant voltage source similar to the constant voltage source shown in FIG. 8. However, in practice, a resistor is included in the constant voltage source on a wiring line between the constant voltage source and the load 130. Therefore, according to FIG. 10, this resistor on the wiring line is treated as the line resistor 170.

Figure 11:
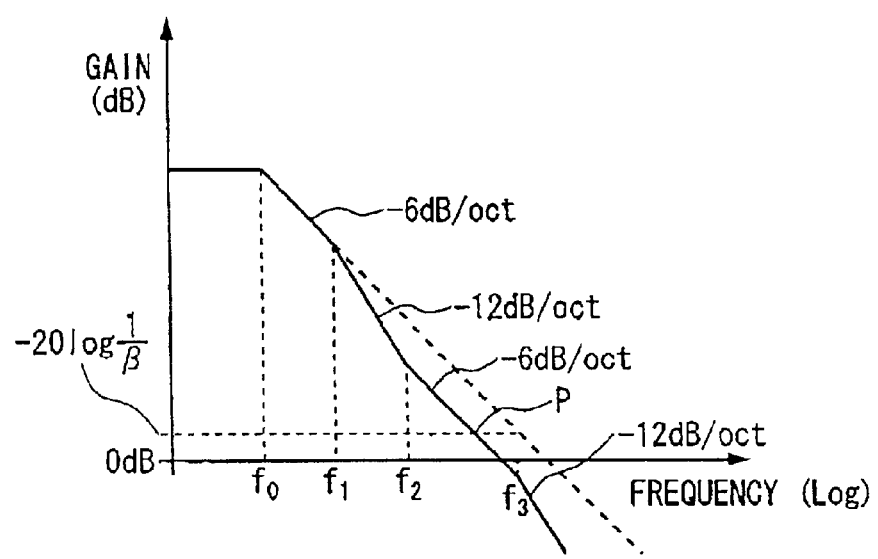
FIG. 11 shows a schematic diagram of frequency characteristic of the constant voltage source shown in FIG. 10.
Figure 12:
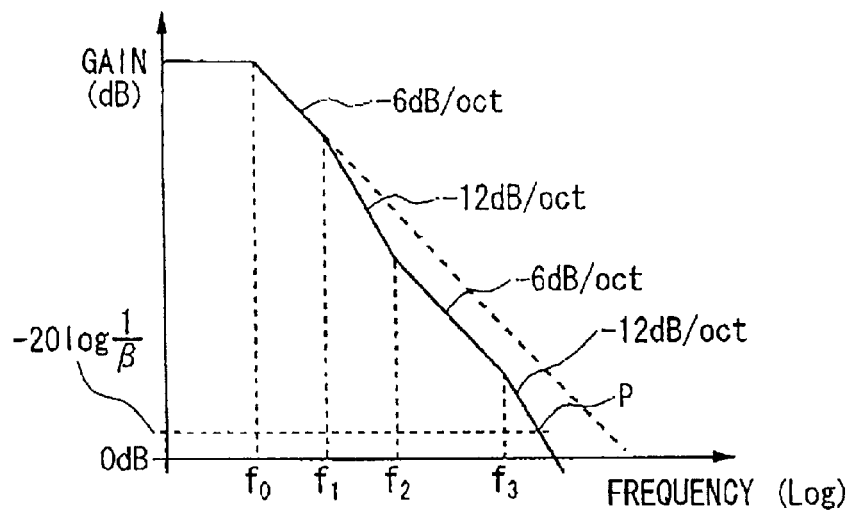
FIG. 12 shows a schematic diagram of frequency characteristic of the constant voltage source shown in FIG. 10.

FIGS. 11 and 12 show schematic diagrams of frequency characteristic of the constant voltage source shown in FIG. 10. According to FIGS. 11 and 12, the influence of existence of the line resistor 170 appears. The phase correcting capacitor 164 removes the influence of the CR circuit of the current measuring resistor 172 and the bypass capacitor 160 in a higher frequency range. However, the line resistor 170 still exists. The line resistor 170 has a very small resistance compared to that of the current measuring resistor 172. Because of this, the frequency characteristics of the CR circuit of the current measuring resistor 170 and the bypass capacitor 160 do not appear in a frequency range lower than the frequency f1. However, in some cases, the frequency characteristics of the CR circuit of the current measuring resistor 170 and the bypass capacitor 160 appear at a frequency f3 higher than the frequency f1.

In case the operating frequency of the load 130 is sufficiently lower than the frequency f3, as shown in FIG. 11, the inclination of the frequency characteristic is −6 dB/oct at the point P. Therefore, the constant voltage source shown in FIG. 10 is stable.

However, recently, the operating speed of a semiconductor device has become increasingly faster. Therefore, it is required that the semiconductor testing apparatus perform a stable operation on a high frequency range by considering line resistances etc. as the operating speed increases. Further, it is also desirable to increase operating speed of the testing apparatus in order to increase throughput.

Here, by increasing the gain of the operational amplifier 120, it is possible to perform testing on the load 130 in a frequency range higher than the frequency f3 However, the constant voltage source shown in FIG. 10 has a frequency characteristic shown in FIG. 12. According to FIG. 12, the inclination of the frequency characteristic is −12 dB/oct at the point P. Therefore, the constant voltage source shown in FIG. 10 is unstable. As a result, the constant voltage source cannot perform stable testing in a frequency range higher than the frequency f3 due to the line resistor 170.

Further, the frequency f3 has a higher value as the bypass capacitor 160 has smaller capacitance. As a result, it is possible to increase the value of the frequency f3 where the influence of the CR circuit having the current measuring resistor 170 and the bypass capacitor 160 by decreasing the capacitance value of the bypass capacitor 160. However, if the capacitance of the bypass capacitor 160 is decreased, it is impossible to fully compensate the variation of the output voltage due to the operation of the load 130. Therefore, it is desired to provide a stable constant voltage source having a bypass capacitor of small capacitance.

Here, as shown in FIG. 1, the compensation circuit 1000 is provided. The compensation circuit 1000 includes the resistor 175, the inductance unit 184 and the bypass capacitor 162. One end of each of the resistor 175, the inductance unit 184 and the bypass capacitor 162 is coupled to one another. The other end of the resistor 175 is coupled to an end of an inductance unit 180 near the constant voltage supplying circuit. The other end of the inductance unit 184 is coupled to a load side end of the inductance unit 180. The other end of the bypass capacitor is coupled to the constant voltage unit 150.

The inductance units 180 and 184 are preferably circuit wirings. Therefore, inductances of the inductance units 180 and 184 are respectively dependent on length of a circuit wiring between the constant voltage supplying circuit 101 and the load 130 and length of a circuit between the bypass capacitor 162 and the load 130. The circuit wiring between the constant voltage supplying circuit 101 and the load 130 is longer than that between the bypass capacitor 162 and the load 130. Therefore, the inductance of the inductance unit 180 is larger than that of the inductance unit 184. Since the bypass capacitor 160 is disposed near the load 130, the inductance 182 between the bypass capacitor 160 and the load 130 is inductance of a probe or a terminal. Therefore, the inductance 182 is significantly smaller than that of the inductance unit 180 or 184. The inductance units 180 or 184 may be an independent element of a desired inductance.

Further, since the bypass capacitor 160 is disposed near the load 130, it is also dependent on the size of the load 130. Therefore, as the semiconductor integrated circuit has been recently miniaturized, it is physically difficult to increase the capacitance of the bypass capacitor 160. On the other hand, the bypass capacitor 162 is coupled to the load 130 through the inductance unit 184. Therefore, the bypass capacitor 162 can be disposed at a relatively far place compared with the bypass capacitor 160. As a result, it is possible to make the bypass capacitor 162 have a physically larger capacitance than the bypass capacitor 160.

Now, details about the compensation for the output voltage variation due to the operation of the load 130 by the bypass capacitors 160 and 162 are described. For example, if the load 130 enters into an operating state from a stand-by state, a large current flows into the load 130 from the constant voltage source 100. According to this, the output voltage of the constant voltage drops. At this moment, the bypass capacitor 160 first supplies currents to the load 130 through the minute inductance 182 by comparing the inductances of the inductance units 180 and 184. This immediately compensates the output voltage drop in regard to the operation of the load 130. However, since the capacitance of the bypass capacitor 160 is small, it is impossible to fully compensate the output voltage drop. Then, the bypass capacitor 162 supplies currents to the load 130 through the inductance unit 184. This compensates the output voltage drop. Next, the constant voltage supplying circuit 101 supplies a predetermined output voltage corrected by the feedback circuit 140 and the operational amplifier 120 to the load 130 through the inductance unit 180. Therefore, the bypass capacitors 160 and 162 perform a step-by-step compensation for the output voltage with at a predetermined time interval. As a result, the output voltage drop due to the operation of the load 130 is relieved. Since the bypass capacitor 162 can have a large capacitance to some degree, it is possible to fully compensate the output voltage drop.

On the other hand, the bypass capacitors 160 and 162 are coupled to each other in parallel. Therefore, it is analogous to include a single bypass capacitor having a capacitance of the sum of the capacitances C160 and C162 of the bypass capacitors 160 and 162, or C160+C162, in the constant voltage supplying circuit 101. As described above with reference to FIGS. 11 and 12, as the capacitance of the bypass capacitor 160 is increased, the frequencies f1 and f3 becomes lower. Therefore, it is possible to perform stable testing in a high frequency range by increasing the capacitance of the bypass capacitor 160. Here, the resistor 175 is included in the compensation circuit 1000. Now, referring to FIG. 13, the function of the resistor 175 is described.

Figure 13:
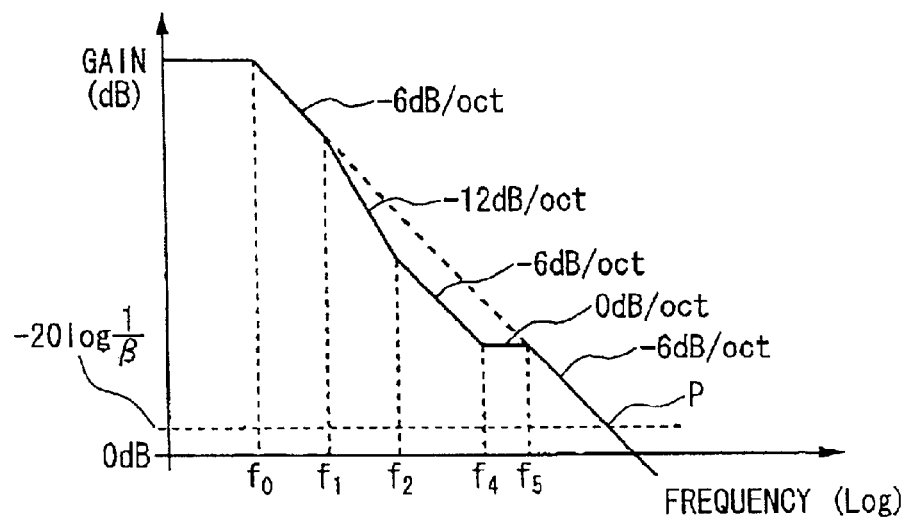
FIG. 13 shows a schematic diagram of frequency characteristic of the constant voltage source, which uses an inductance unit, including a first compensation circuit shown in FIG. 10.

FIG. 13 shows a schematic diagram of frequency characteristic of the constant voltage source shown in FIG. 1, which uses the inductance unit 180, including the compensation circuit 1000. The bypass capacitors 160 and 162 can be ignored in regard to the resistor 175, inductance unit 180 and the inductance unit 184 in a frequency range higher than a predetermined frequency f4. By making the inductance unit 180 sufficiently larger than the inductance unit 184, it is possible to make the resonance frequency lower than the frequency f4, where the resonance occurs between the inductance unit 180 and the bypass capacitors 160 and 162. Therefore, in case the frequency is gradually increased, first, by the influence of the inductance unit 180, the constant voltage supplying circuit 101 operates as it is coupled to the bypass capacitor 162 through the resistor 175 and to the bypass capacitor 160 through the inductance unit 184. Further, in case the frequency is gradually increased, impedances of the bypass capacitors 160 and 162 are decreased along the increase of the frequency, and if the frequency becomes higher than the frequency f4, impedances of the bypass capacitors 160 and 162 become smaller than the impedance of the resistor 175. The constant voltage supplying circuit 101 operates as it is coupled to the bypass capacitors 160 and 162 through the resistor 175. Therefore, when the frequency is higher than the frequency f4, the bypass capacitors 160 and 162 can be ignored in regard to the constant voltage supplying circuit 101 in a frequency range higher than the frequency f4, so that impedance becomes the resistance of the resistor 175. As a result, the influence of the CR circuit of the line resistor 170 and the bypass capacitors 160 and 162 can be ignored. Further, the frequency characteristic curve of the constant voltage source 100 has an inclination of 0 dB/oct in a frequency range higher than the frequency f4. But, since it is limited by the frequency characteristic of the operational amplifier 120, the inclination of the frequency characteristic curve of the constant voltage source 100 returns to −6 dB/oct at a predetermined frequency f5. Accordingly, since the inclination of the frequency characteristic curve at point P is −6 dB/oct, the constant voltage source 100 is stable in a high frequency range. Further, even though the gain of the operational amplifier 120 is increased, the constant voltage source 100 does not become unstable.

Figure 14:
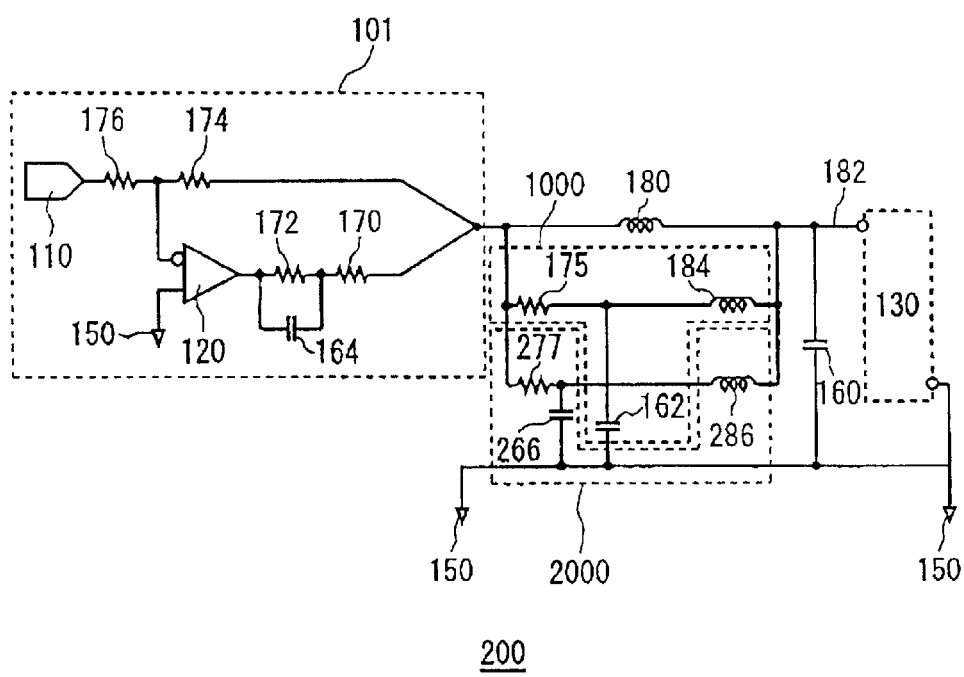
FIG. 14 shows a constant voltage source of another embodiment according to the present invention.

FIG. 14 shows a constant voltage source of another embodiment according to the present invention. According to the present embodiment, a constant voltage source 200 includes a second compensation circuit 2000 in addition to the constant voltage circuit 100. The compensation circuit 2000 includes a resistor 277, an inductance unit 286 and a bypass capacitor 266, one end of each of which is coupled to one another. The other end of the resistor 175 is coupled to an end of the inductance unit 180 near the constant voltage supplying circuit, the other end of the inductance unit 184 is coupled to a load side end of the inductance unit 180, and the other end of the bypass capacitor is coupled to the constant voltage unit 150.

The inductance units 180, 184 and 286 are preferably circuit wiring lines. Therefore, inductance of the inductance unit 180 is dependent on a length of the wiring line between the constant voltage supplying circuit 101 and the load 130. Inductance of the inductance unit 184 is dependent on a length of the wiring line between the bypass capacitor 162 and the load 130. Inductance of the inductance unit 286 is dependent on a length of the wiring line between the bypass capacitor 266 and the load 130. The wiring line between the bypass capacitor 266 and the load 130 is longer than that between the bypass capacitor 162 and the load 130. Accordingly, inductance of the inductance unit 286 is larger than that of the inductance unit 184. The wiring line between the constant voltage supplying circuit 101 and the load 130 is longer than that between bypass capacitor 266 and the load 130. Accordingly, inductance of the inductance unit 180 is larger than that of the inductance unit 286. The inductance 182 is extremely small compared with the inductances of the inductance unit 180, 184 or 286. The inductance unit 180, 184 or 286 can be an independent element of desired inductance.

Further, the bypass capacitor 266 is coupled to the load 130 through the inductance unit 286. Accordingly, the bypass capacitor 266 can be disposed at a relatively far place compared with the bypass capacitors 160 and 162. As a result, it is possible to make the bypass capacitor 266 have a physically larger capacitance than the bypass capacitors 160 and 162.

Now, details about the compensation for the output voltage variation due to the operation of the load 130 by the bypass capacitors 160, 162 and 266 are described. For example, if the load 130 enters into an operating state from a stand-by state, a large current flows into the load 130 from the constant voltage source 100. According to this, the output voltage of the constant voltage drops. At this moment, the bypass capacitor 160 first supplies currents to the load 130 through the minute inductance 182 by comparing the inductances of the inductance units 180, 184 and 286. This immediately compensates the output voltage drop in regard to the operation of the load 130. However, since the capacitance of the bypass capacitor 160 is small, it is impossible to fully compensate the output voltage drop. Then, the bypass capacitor 162 supplies currents to the load 130 through the inductance unit 184. Then, the output voltage drop is compensated. However, in some cases, even by the bypass capacitor 162, it is still impossible to fully compensate the output voltage drop. Then, the bypass capacitor 266 supplies currents to the load 130 through the inductance unit 286. Then, the output voltage drop is compensated. Next, the constant voltage supplying circuit 101 supplies a predetermined output voltage corrected by the feedback circuit 140 and the operational amplifier 120 to the load 130 through the inductance unit 180. Therefore, the bypass capacitors 160, 162 and 266 perform a step-by-step compensation for the output voltage with at a predetermined time interval. As a result, the output voltage drop due to the operation of the load 130 is relieved. Since the bypass capacitor 266 can still have a large capacitance compared to the bypass capacitor 162, it is possible to fully compensate the output voltage drop.

The constant voltage source 200 may include an additional compensation circuit like the compensation circuits 1000 and 2000. The frequency characteristic of the constant voltage source 200 is similar to that shown in FIG. 13 and is omitted. But, because of the additional elements of the bypass capacitor 266, inductance unit 286 and the resistor 277, the value of the frequency f1, f4 or f5 may be shifted.

Figure 15:
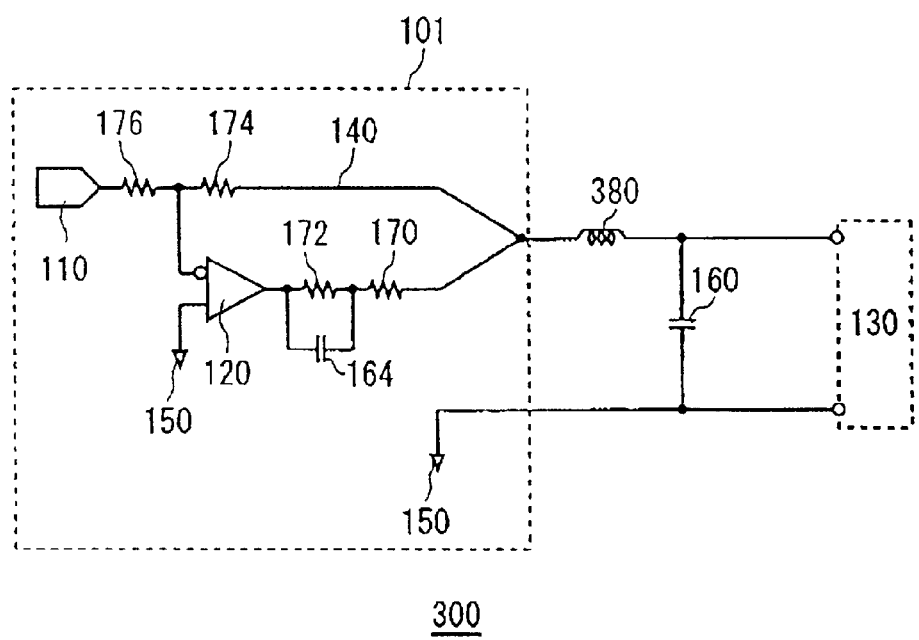
FIG. 15 shows a constant voltage source including an inductance unit between the constant voltage supplying circuit and a load.
Figure 16:
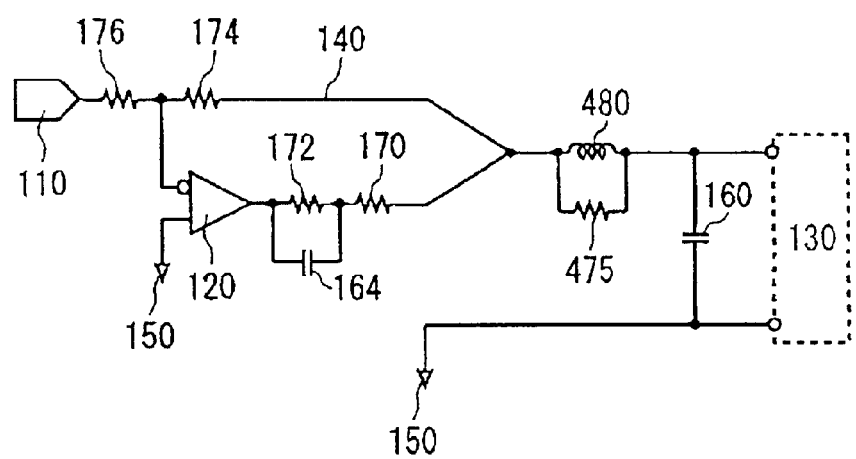
FIG. 16 shows a constant voltage source including an inductance unit between the constant voltage supplying circuit and a load and a resistor coupled to the inductance unit in parallel.
Figure 17:
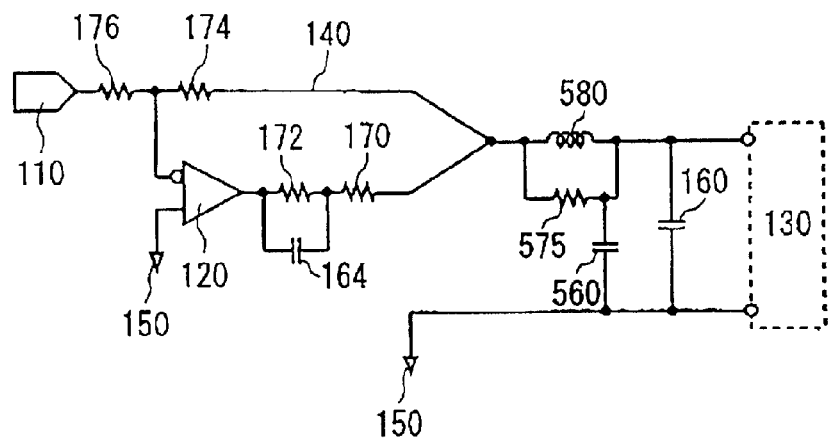
FIG. 17 shows a constant voltage source including an inductance unit between the constant voltage supplying circuit and a load, a resistor coupled to the inductance unit in parallel and a bypass capacitor, where, one terminal of the bypass capacitor is coupled to a load side terminal of the resistor and the other terminal of the bypass capacitor is coupled to a constant voltage unit.

FIGS. 15 to 17 show other embodiments of the constant voltage source according to the present invention. FIG. 15 shows a constant voltage source 300 including an inductance unit 380 between the constant voltage supplying circuit 101 and the load 130. The bypass capacitor 160 can be ignored in regard to the inductance unit 360 and the constant voltage supplying circuit 101 in a high frequency range. The influence of the CR circuit of the line resistor 170 and the bypass capacitor 160 can be ignored. Therefore, in the case where the capacitance of the capacitor 160 is increased, the constant voltage source 300 can supply a stable output voltage to the load 130.

FIG. 16 shows a constant voltage source 400 including an inductance unit 480 between the constant voltage supplying circuit 101 and the load 130 and a resistor 475 coupled to the inductance unit 480 in parallel. The bypass capacitor 160 can be ignored in regard to the inductance unit 480, the resistor 475 and the constant voltage supplying circuit 101 in a high frequency range. The influence of the CR circuit of the line resistor 170 and the bypass capacitor 160 can be ignored. Therefore, in the case where the capacitance of the capacitor 160 is increased, the constant voltage source 400 can supply a stable output voltage to the load 130.

FIG. 17 shows a constant voltage source 500 including an inductance unit 580 between the constant voltage supplying circuit 101 and the load 130, a resistor 575 coupled to the inductance unit 580 in parallel and a bypass capacitor 560, where, one terminal of the bypass capacitor 560 is coupled to the load 130 side terminal of the resistor 575 and the other terminal of the bypass capacitor 560 is coupled to the constant voltage unit 150. The bypass capacitors 160 and 560 can be ignored in regard to the inductance unit 580, the resistor 575 and the constant voltage supplying circuit 101 in a high frequency range. The influence of the CR circuit of the line resistor 170 and the bypass capacitors 160 and 560 can be ignored. Therefore, the constant voltage source 500 can supply a stable output voltage to the load 130. In practice, the constant voltage source 500 is analogous to the constant voltage source 100 including the inductance unit 184 as a wiring line, as shown in FIG. 1.

According to an embodiment of the present invention, the constant voltage source can supply a predetermined output voltage to a load independently of variations of currents supplied to the load. Further, in case the output voltage varies according to the variation of currents supplied to the load, the constant voltage source can fully correct the output voltage supplied to the load. Further, it is possible to supply a stable output voltage from the constant voltage source to the load in a high operating frequency range as the operation speed of the semiconductor integrated circuit is increased. It is also possible to provide a semiconductor integrated circuit testing apparatus which performs stable testing in a high operating frequency range as the operation speed of the semiconductor integrated circuit is increased. Further, it is also possible to increase operating speed of the testing apparatus in order to increase throughput.

Next, embodiments of a layout of the compensation circuit of the constant voltage source according to the present invention are described. For example, layouts of the compensation circuits 1000 and 2000 of the constant voltage source 200 shown in FIG. 14.

Figure 18:
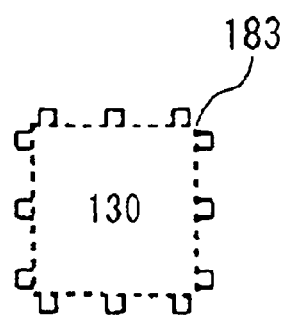
FIG. 18 shows a load.

FIG. 18 shows the load 130. The load 130 includes a power source terminal 183 to which the output voltage is supplied by the constant voltage source 200. For example, the load 130 may be electric devices such as a semiconductor integrated circuit device. But, the load 130 is only a specimen, and does not form a part of a constant voltage source or a constant voltage source circuit board according to the present invention. Therefore, in the drawing, the load 130 is drawn in dotted line.

Figure 19:
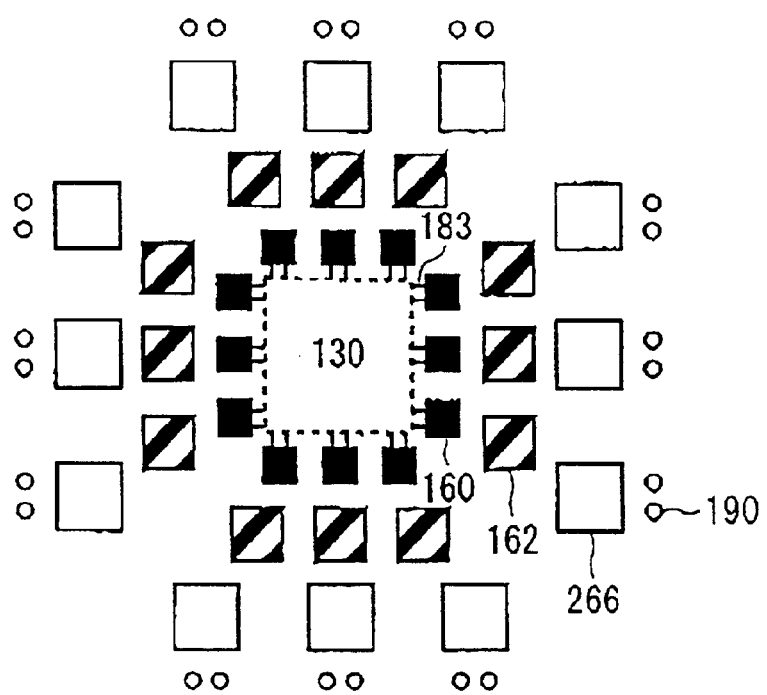
FIG. 19 shows bypass capacitors and output terminals of a constant voltage supplying circuit around the load.

FIG. 19 shows bypass capacitors 160, 162 and 266 and output terminals 190 of the constant voltage supplying circuit 101. The bypass capacitors 160, 162 and 266 are disposed around the load 130. However, the number of the capacitors 160, 162 or 266 and their dispositions may be randomly selected. For example, the bypass capacitors 160, 162 and 266 may be disposed in a box, U-shaped, O-shaped or L-shaped type. Further, the bypass capacitors 160, 162 and 266 may be piled up on the load in a multi-layer type. The bypass capacitor 160 is disposed near the power source terminal 183 in order to make the inductance 152 small. Therefore, the smaller the load 130 becomes, the more the size of the bypass capacitor 160 is limited. Since the capacitance is proportional to area of the electrode, the capacitance of the bypass capacitor 160 is also limited.

The bypass capacitor 162 is disposed at a farther place than the bypass capacitor 160. Since the distance from the load 130 is far, the sizes of electrodes of the bypass capacitor 162 can be larger than those of the bypass capacitor 160. Further, the bypass capacitor 266 is disposed at a farther place than the bypass capacitors 160 and 162. Since the distance from the load 130 is far, the sizes of electrodes of the bypass capacitor 266 can be larger than those of the bypass capacitors 160 and 162. It is possible to form additional bypass capacitors at a farther place than the bypass capacitors 266.

Figure 20:
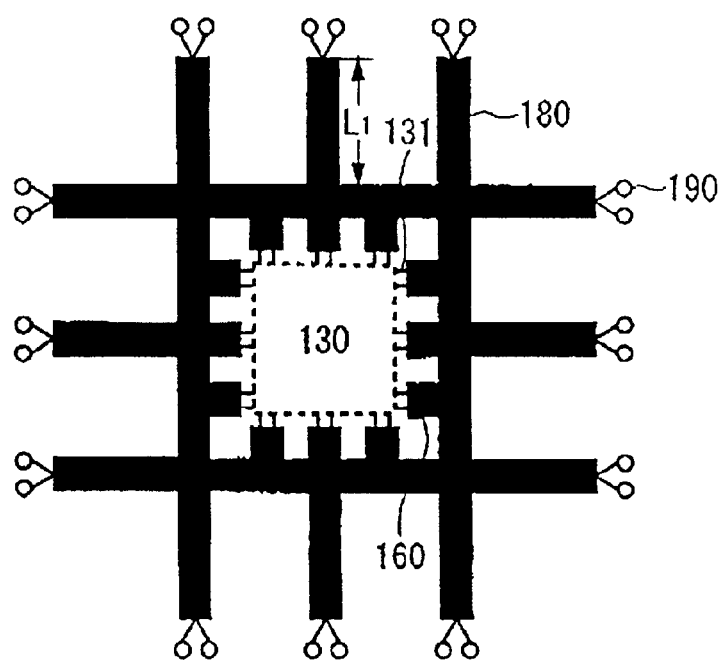
FIG. 20 shows wiring lines formed on the bypass capacitors etc. between the constant voltage supplying circuit and the load.

FIG. 20 shows wiring lines formed on the bypass capacitors etc. between the constant voltage supplying circuit 101 and the load 130. According to the present embodiment, the inductance unit 180 is a wiring line. Further, the wiring line is disposed around the load 130 and includes a box-type unit coupled to an electrode of the bypass capacitor 160 and a longish unit elongated from the wiring line of the box-type unit to a terminal 190. The box-type unit has minute inductance compared with the longish unit. Therefore, the inductance of the inductance unit 180 is determined by the length L1 of the wiring line of the longish unit between the terminal 190, where the output from the constant voltage supplying circuit 101 is coupled, and the box-type unit. The shape of the wiring line is not limited to a box or longish type. For example, the box-type wiring line can be formed in a round-type or formed to be round or square wiring lines which cover the load 130 or the bypass capacitor 160. But, in order to keep the inductance of the inductance unit 180, it is preferable for the wiring lines to include a thin and long portion. Further, it is also preferable to couple the box-type unit of the wiring lines to the bypass capacitors 160 by piling up the wiring lines over the one electrode of the bypass capacitor 160.

Figure 21:
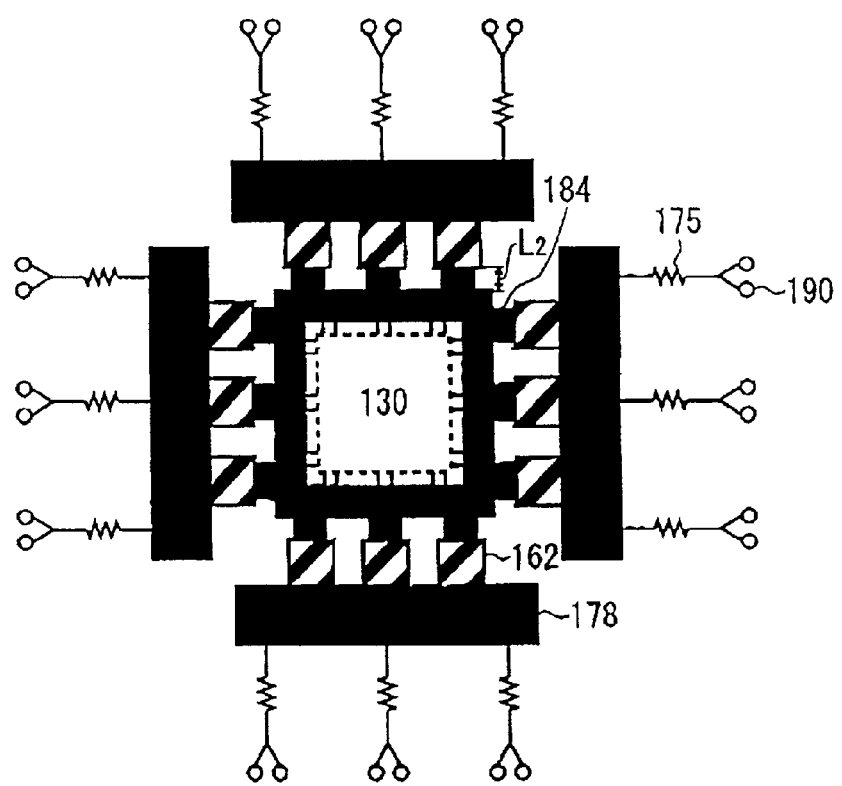
FIG. 21 shows bypass capacitors, inductance units and resistors of a compensation circuit.

FIG. 21 shows the bypass capacitors 162, the inductance units 184 and resistors 175 of the compensation circuit 1000. According to the present embodiment, the inductance unit 184 is a wiring line. Further, the wiring line includes a box-type unit disposed around the load 130 and a longish unit elongated from the wiring line of the box-type unit to a terminal 190. The box-type unit has minute inductance compared with the longish unit. The box-type unit is coupled with the bypass capacitors 160 to be piled up over the one electrode of the bypass capacitor 160. Therefore, the inductance of the inductance unit 184 is determined by the length L2 of the wiring line of the longish unit between the bypass capacitor 162 and the box-type unit. The shape of the wiring line is not limited to a box or longish type. For example, the box-type wiring line can be formed in a round-type or formed to be a round or square wiring lines which cover the load 130 or the bypass capacitor 160. But, in order to keep the inductance of the inductance unit 184, it is preferable for the wiring lines to include a thin and long portion. Further, it is also preferable to couple the box-type unit of the wiring lines to the bypass capacitors 160 by piling up the wiring lines over the box-type unit of the wiring lines shown in FIG. 20. Since the line L2 is shorter than the line L1, the inductance of the inductance unit 184 is smaller than the inductance of the inductance unit 180.

A resistor is coupled between the bypass capacitor 162 and the power source terminal 190. According to the present embodiment, a low resistance resistor 178 is coupled from the resistor 175 to the bypass capacitor 162.

Figure 22:
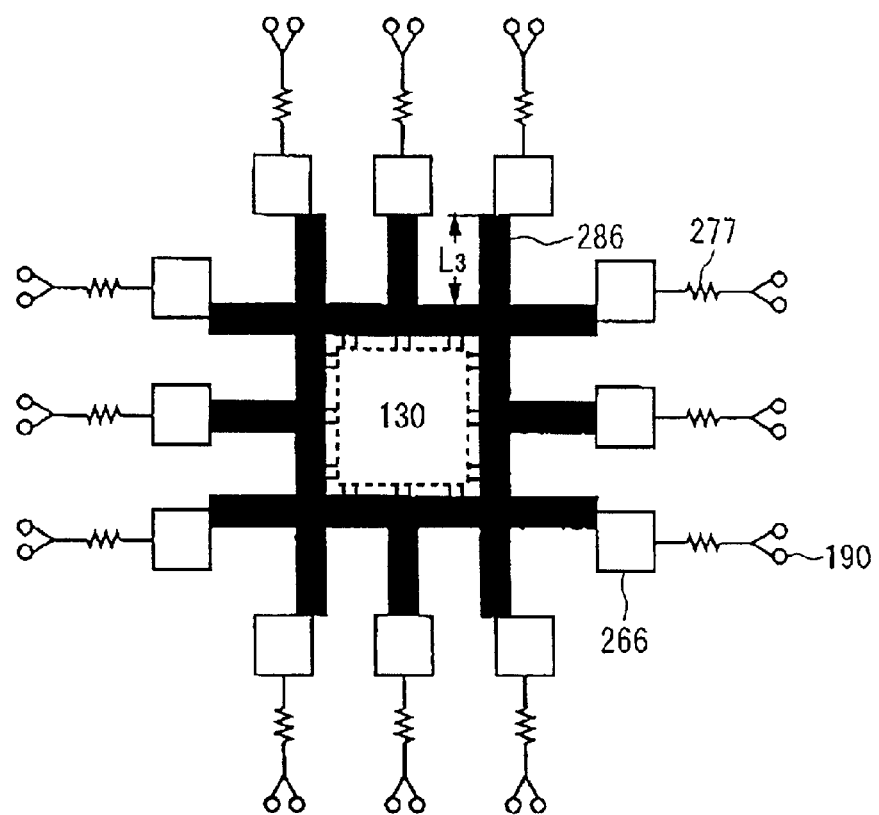
FIG. 22 shows bypass capacitors, inductance units and resistors of a second compensation circuit.

FIG. 22 shows the bypass capacitors 266, the inductance units 286 and the resistors 277 of the compensation circuit 2000. According to the present embodiment, the inductance unit 286 is a wiring line. Further, the wiring line includes a box-type unit disposed around the load 130 and a longish unit elongated from the wiring line of the box-type unit to a terminal 190. The box-type unit has minute inductance compared with the longish unit. Further, it is also preferable to couple the box-type unit of the wiring lines to the bypass capacitors 160 by piling up the wiring lines over the box-type unit of the wiring lines shown in FIG. 21, in other words, over the one electrode of the bypass capacitor 160. Therefore, the inductance of the inductance unit 286 is determined by the length L3 of the wiring line of the longish unit between the bypass capacitor 162 and the box-type unit. The shape of the wiring line is not limited to a box or longish type. For example, the box-type wiring line can be formed in a round-type or formed to be round or square wiring lines which cover the load 130 or the bypass capacitor 160. But, in order to keep the inductance of the inductance unit 286, it is preferable for the wiring lines to include a thin and long portion. Further, it is also preferable to couple the box-type unit of the wiring lines to the bypass capacitors 160 by piling up the wiring lines over the box-type unit of the wiring lines shown in FIG. 20. Since the line L3 is shorter than the line L1 and longer than the line L2. Accordingly, the inductance of the inductance unit 286 is smaller than the inductance of the inductance unit 180 and larger than that of the inductance unit 184.

A resistor is coupled between the bypass capacitor 162 and the power source terminal 190. According to the present embodiment, the compensation circuit may be formed by piling up the wiring lines themselves. Further, the compensation circuit may be formed by piling the wiring lines over the electrodes of the bypass capacitors. Further, the compensation circuit may be formed by piling the wiring lines over the load. At this moment, by inserting insulating materials during piling up the wiring lines, it is possible to insulate the wiring lines, bypass capacitors or the load. Further, it is also possible to insulate the wiring lines, bypass capacitors or the load without inserting the insulating materials during piling up of the wiring lines. Still another structure of the compensation circuit may occur to an ordinary skilled person in the art.

It is preferable to form a structure where the wiring lines, bypass capacitors, the load and the resistors are piled up. However, it is also possible to be disposed in parallel. The wiring lines may be made using only one material or more than two kinds of material. For example, Au, Ag, Pt, doped polysilicon, etc. may be used as the wiring lines. Further, for example, glass may be used as an insulating material. Materials for the resistor also do not have any restriction except that desired resistance can be achieved.

According to the present invention, a constant voltage source can supply a predetermined level of output voltage to the load without variation of current supplied to the load. Further, in case the output voltage varies according to the variation of current supplied to the load, it is possible for the constant voltage source to fully correct the output voltage to the load while feedback of the output voltage by the feedback circuit can follow the voltage variation. Further, it is possible to supply a stable output voltage from the constant voltage source to the load in a high operating frequency range as the operation speed of the semiconductor integrated circuit is increased. It is also possible to provide a semiconductor integrated circuit testing apparatus which performs stable testing in a high operating frequency range as the operation speed of the semiconductor integrated circuit is increased. Further, it is also possible to increase operating speed of the testing apparatus in order to increase throughput.

Although the present invention has been described by way of exemplary embodiments, it should be understood that those skilled in the art might make many changes and substitutions without departing from the spirit and the scope of the present invention which is defined only by the appended claims.

What is claimed is:

1. A constant voltage source comprising:
   a constant voltage supplying circuit comprising an operational amplifier for supplying an output voltage to a load and a feedback circuit for feeding back said output voltage to said operational amplifier;
   a first inductance unit disposed between said constant voltage supplying circuit and said load;
   a first bypass capacitor of which one terminal is couple between said first inductance unit and said load and the other terminal is coupled to a constant voltage unit; and
   a compensation circuit comprising a second resistor, a second inductance unit and a second bypass capacitor, one end of each of said second resistor, said second inductance unit, and said second bypass capacitor being coupled to each other,
   wherein the other end of said second resistor is coupled to an end of said first inductance unit near said constant voltage supplying circuit, the other end of said second inductance unit is coupled to a load said end of said first inductance unit and the other end of said second bypass capacitor is coupled to said constant voltage unit.

2. A constant voltage source as claimed in claim 1, wherein inductance between said second bypass capacitor and said load is larger than inductance between said first bypass capacitor and said load.

3. A constant voltage source as claimed in claim 1, wherein capacitance of said second bypass capacitor is larger than capacitance of said first bypass capacitor.

4. A constant voltage source as claimed in claim 1, wherein inductance of said second inductance unit is smaller than inductance of said first inductance unit.

5. A constant voltage source as claimed in claim 1, wherein at least one of the inductances between respective said first and second bypass capacitors and said load is inductance of respective wiring lines between said first and second bypass capacitors and said load.

6. A constant voltage source as claimed in claim 5, wherein inductances between respective said first and second bypass capacitors and said load are inductances of wiring lines between said first or second bypass capacitors and said load,
   and said first and second inductance units are wiring lines.

7. A constant voltage source as claimed in claim 1, wherein at least one of said first and second inductance units is wiring line.

8. A constant voltage source as claimed in claim 1, further comprising:
   a first compensation circuit comprising a second resistor, a second inductance unit and a second bypass capacitor, one end of each of said second resistor, said second inductance unit and said second bypass capacitor being coupled to each other, wherein the other end of said second resistor is coupled to an end of said first inductance unit near said constant voltage supplying circuit, the other end of said second inductance unit is coupled to a load side end of said first inductance unit and the other end of said second bypass capacitor is coupled to said constant voltage unit; and
   a second compensation circuit comprising a third resistor, a third inductance unit and a third bypass capacitor, one end of each of said third resistor, said third inductance unit and said third bypass capacitor being coupled to each other, wherein the other end of said third resistor is coupled to an end of said first inductance unit near said constant voltage supplying circuit, the other end of said third inductance unit is coupled to a load side end of said first inductance unit and the other end of said third bypass capacitor is coupled to said constant voltage unit.

9. A constant voltage source as claimed in claim 8, wherein inductance between said second bypass capacitor and said load is larger than inductance between said first bypass capacitor and said load, and inductance between said third bypass capacitor and said load is larger than inductance between said second bypass capacitor and said load.

10. A constant voltage source as claimed in claim 8, wherein capacitance of said second capacitor is larger than capacitance of said first capacitor, and capacitance of said third capacitor is larger than capacitance of said second capacitor.

11. A constant voltage source as claimed in claim 8, wherein inductances of said second and third inductance units are smaller than inductance of said first inductance unit, and inductance of said third inductance unit is larger than inductance of said second inductance unit.

12. A constant voltage source as claimed in claim 8, wherein resistance of said third resistor is larger than resistance of said second resistor.

13. A constant voltage source as claimed in claim 8, wherein at least one of inductances between respective said first, second and third bypass capacitors and said load is inductance of respective wiring lines between said first, second and third bypass capacitors and said load.

14. A constant voltage source as claimed in claim 13, wherein inductances between respective said first, second and third bypass capacitors and said load are inductances of respective wiring lines between said first, second and third bypass capacitors and said load, and said first, second and third inductance units are wiring lines.

15. A constant voltage source as claimed in claim 1, wherein at least one of said first, second and third inductance units is wiring line.

16. A constant voltage source circuit board comprising:
a constant voltage supplying circuit comprising an operational amplifier for supplying an output voltage to a load and a feedback circuit for feeding back said output voltage to said operational amplifier;
a first inductance unit disposed between said constant voltage supplying circuit and said load; and
a first bypass capacitor of which one terminal is coupled between said first inductance unit and said load and the other terminal is coupled to a constant voltage unit,
wherein said first bypass capacitor is disposed near said load; and
a first compensation circuit comprising a second resistor, a second inductance unit and a second bypass capacitor, one end of each of said second resistor, said second inductance unit and said second bypass capacitor being coupled to each other, wherein the other end of said second resistor is coupled to an end of said first inductance unit near said constant voltage supplying circuit, the other end of said second inductance unit is coupled to a load side end of said first inductance unit and the other end of said second bypass capacitor is coupled to said constant voltage unit; and
said second bypass capacitor is disposed at a place farther than a place where said first bypass capacitor is disposed from said load.

17. A constant voltage source circuit board as claimed in claim 16, wherein at least one of inductances between respective said first and second bypass capacitors and said load is inductance of respective wiring lines between said first and second bypass capacitors and said load.

18. A constant voltage source circuit board as claimed in claim 17, wherein inductances between respective said first and second bypass capacitors and said load are respectively inductances of wiring lines between said first and second bypass capacitors and said load, and said first and second inductance units are wiring lines.

19. A constant voltage source circuit board as claimed in claim 17, wherein at least a portion of said wiring line is disposed around said load.

20. A constant voltage source circuit board as claimed in claim 17, wherein at least a portion of at least one of wiring lines between respective said first, second and third bypass capacitors and said load is piled over other wiring line.

21. A constant voltage source circuit board as claimed in claim 20, wherein said one wiring line is insulated from said other wiring line.

22. A constant voltage source circuit board as claimed in claim 17, wherein at least a portion of at least one of wiring lines between respective said first, second and third bypass capacitors and said load is formed to pile up over at least one of said first, second and third bypass capacitors.

23. A constant voltage source circuit board as claimed in claim 22, wherein said one wiring line is coupled to an electrode of said at least one of said first, second and third bypass capacitors.

24. A constant voltage source circuit board as claimed in claim 17, wherein at least a portion of at least one of wiring lines between respective of said first, second and third bypass capacitors and said load is formed to pile up over said load.

25. A constant voltage source circuit board as claimed in claim 16, wherein capacitance of said second capacitor is larger than capacitance of said first capacitor.

26. A constant voltage source circuit board as claimed in claim 16, wherein inductance of said second inductance unit is smaller than inductance of said first inductance unit.

27. A constant voltage source circuit board as claimed in claim 16 further comprising:
a second compensation circuit comprising a third resistor, a third inductance unit and a third bypass capacitor, one end of each of said third resistor, said third inductance unit and said third bypass capacitor being coupled to each other,
wherein the other end of said third resistor is coupled to an end of said first inductance unit near said constant voltage supplying circuit, the other end of said third inductance unit is coupled to a load side end of said first inductance unit and the other end of said third bypass capacitor is coupled to said constant voltage unit, and
said third bypass capacitor is disposed at a place farther than a place where said second bypass capacitor is disposed from said load.

28. A constant voltage source circuit board as claimed in claim 27, wherein at least one of inductances between respective said first, second and third bypass capacitors and said load is inductance of respective wiring lines between said first, second and third bypass capacitors and said load.

29. A constant voltage source circuit board as claimed in claim 27, wherein at least one of said first, second and third inductance units is wiring line.

30. A constant voltage source circuit board as claimed in claim 27, wherein inductance between respective said first, second or third bypass capacitors and said load is inductance of respective wiring lines between said first, second or third bypass capacitors and said load, and said first, second or third inductance units is wiring lines, respectively.

31. A constant voltage source circuit board as claimed in claim 27, wherein capacitance of said second capacitor is larger than capacitance of said first capacitor, and capacitance of said third capacitor is larger than capacitance of said second capacitor.

32. A constant voltage source circuit board as claimed in claim 27, wherein inductance of said third inductance unit is larger than inductance of said second inductance unit and smaller than inductance of said first inductance unit.

33. A constant voltage source circuit board as claimed in claim 27, wherein at least one of said first, second and third bypass capacitors is disposed around said load.

34. A constant voltage source circuit board as claimed in claim 16, wherein at least one of said first and second inductance units is wiring line.

35. A method for supplying a predetermined voltage to a load comprising steps of:

generating a voltage by using a constant voltage supplying circuit comprising an operational amplifier for generating said voltage supplied to said load and a feedback circuit for feeding back said output voltage from said operational amplifier to said operational amplifier;

supplying said voltage to said load through a first inductance unit disposed between said constant voltage supplying circuit and said load;

supplying a current to said load by using a first bypass capacitor of which one terminal is coupled between said first inductance unit and said load and the other terminal is coupled to a constant voltage unit;

charging said first bypass capacitor through said first inductance unit; and compensating an output voltage by using a compensation circuit comprising a second resistor, a second inductance unit and a second bypass capacitor, one end of each of said second resistor, said second inductance unit and said second bypass capacitor being coupled to each other, wherein the other end of said second resistor is coupled to an end of said first inductance unit near said constant voltage supplying circuit, the other end of said second inductance unit is coupled to a load side end of said first inductance unit and the other end of said second bypass capacitor is coupled to said constant voltage unit.

\* \* \* \* \*